(12) United States Patent
Wendler et al.

(10) Patent No.: US 9,052,092 B2
(45) Date of Patent: *Jun. 9, 2015

(54) SEALED PIXEL ASSEMBLIES, KITS AND METHODS

(71) Applicant: Daktronics, Inc., Brookings, SD (US)

(72) Inventors: Brett David Wendler, Watertown, SD (US); Eric Steven Bravek, Brookings, SD (US); Erich J. Grebel, Amarillo, TX (US)

(73) Assignee: Daktronics, Inc., Brookings, SD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,419

(22) Filed: Sep. 16, 2013

(65) Prior Publication Data

US 2014/0016319 A1      Jan. 16, 2014

Related U.S. Application Data

(63) Continuation of application No. 12/987,584, filed on Jan. 10, 2011, now Pat. No. 8,552,928, which is a continuation of application No. 11/895,424, filed on Aug. 24, 2007, now Pat. No. 7,868,903, which is a (Continued)

(51) Int. Cl.
*F21S 4/00*          (2006.01)
*F21V 15/01*         (2006.01)

(Continued)

(52) U.S. Cl.
CPC . *F21V 15/01* (2013.01); *G09F 9/33* (2013.01); *G09F 13/22* (2013.01); *G09G 3/32* (2013.01); *G09G 2310/0221* (2013.01);

(Continued)

(58) Field of Classification Search
CPC ........................................... G02B 26/00
USPC .................................................... 362/249
See application file for complete search history.

(56) References Cited

U.S. PATENT DOCUMENTS 4,263,736 A      4/1981   Beierwaltes et al.
4,307,937 A *   12/1981   Gordon ..................... 385/39

(Continued)

FOREIGN PATENT DOCUMENTS

AU    2003203350 A1    7/2003
AU    2005329700 B2    9/2006

(Continued)

OTHER PUBLICATIONS

"3-channel constant-current LED Driver with PWM control", (A6280-DS, Rev. 3), Allegro Microsystems Inc, [online]. [archived May 7, 2007]. Retrieved from the Internet:<URL:http://web.archive.org/web/20070507171052/http://www.allegromicro.com/en/Products/Part_Numbers/6280/6280>, 12 pgs.

(Continued)

*Primary Examiner* — Javid A Amini
(74) *Attorney, Agent, or Firm* — Schwegman Lundberg & Woessner, P.A.

(57) ABSTRACT

Discrete flexible pixel assemblies can be hermetically sealed from the environment and can comprise unitary, self-contained replaceable modules which enable efficient, economical production of large scale, free-form electronic displays, signs and lighting effects for outdoor use. The method and means for producing hermetically sealed discrete flexible pixel assemblies can include encapsulation means, exterior encasement means, and cable connector means.

20 Claims, 9 Drawing Sheets

Related U.S. Application Data continuation-in-part of application No. 10/965,133, filed on Oct. 14, 2004, now Pat. No. 7,893,948.

(60) Provisional application No. 60/926,706, filed on Apr. 27, 2007.

(51) Int. Cl.
| | |
|---|---|
| G09F 9/33 | (2006.01) |
| G09F 13/22 | (2006.01) |
| H05K 5/06 | (2006.01) |
| G09G 3/06 | (2006.01) |
| G09F 9/30 | (2006.01) |
| G09G 3/32 | (2006.01) |
| H05K 3/28 | (2006.01) |

(52) U.S. Cl.
CPC .............. *H05K 3/284* (2013.01); *H05K 5/064* (2013.01); *G09G 3/06* (2013.01); *G09F 9/301* (2013.01)

(56) References Cited

U.S. PATENT DOCUMENTS

| | | | |
|---|---|---|---|
| 4,334,245 A | 6/1982 | Michael | |
| 4,539,598 A | 9/1985 | Dietrich et al. | |
| 4,751,446 A | 6/1988 | Pineda et al. | |
| 4,839,726 A | 6/1989 | Balopole et al. | |
| 5,067,019 A | 11/1991 | Juday et al. | |
| 5,079,636 A | 1/1992 | Brody | |
| 5,151,689 A | 9/1992 | Kabuto et al. | |
| 5,164,853 A | 11/1992 | Shimazaki | |
| 5,168,375 A | 12/1992 | Reisch et al. | |
| 5,251,296 A | 10/1993 | Rhoden et al. | |
| 5,261,050 A | 11/1993 | Fox et al. | |
| 5,363,318 A | 11/1994 | McCauley | |
| 5,382,811 A | 1/1995 | Takahashi | |
| 5,399,390 A | 3/1995 | Akins | |
| 5,400,229 A | 3/1995 | Lin | |
| 5,440,648 A | 8/1995 | Roberts et al. | |
| 5,475,400 A | 12/1995 | Sellers et al. | |
| 5,523,769 A | 6/1996 | Lauer et al. | |
| 5,600,574 A | 2/1997 | Reitan | |
| 5,642,125 A | 6/1997 | Silverstein et al. | |
| 5,767,822 A | 6/1998 | Hiroshi et al. | |
| 5,796,376 A | 8/1998 | Banks | |
| 5,805,117 A | 9/1998 | Mazurek et al. | |
| 5,815,168 A | 9/1998 | May | |
| 5,946,005 A | 8/1999 | Chiang | |
| 5,949,483 A | 9/1999 | Fossum et al. | |
| 5,949,581 A | 9/1999 | Kurtenbach et al. | |
| 6,054,968 A | 4/2000 | De Matteo | |
| 6,072,446 A | 6/2000 | Tokimoto | |
| 6,169,632 B1 | 1/2001 | Kurtenbach et al. | |
| 6,219,099 B1 | 4/2001 | Johnson et al. | |
| 6,259,838 B1 | 7/2001 | Singh et al. | |
| 6,265,984 B1 | 7/2001 | Molinaroli | |
| 6,291,024 B1 | 9/2001 | Deroch et al. | |
| 6,330,111 B1 | 12/2001 | Myers | |
| 6,335,728 B1 | 1/2002 | Kida et al. | |
| 6,362,801 B1 | 3/2002 | Yuhara | |
| 6,400,340 B1 | 6/2002 | Nishida | |
| 6,536,914 B2 | 3/2003 | Hoelen et al. | |
| 6,538,375 B1 | 3/2003 | Duggal et al. | |
| 6,566,824 B2* | 5/2003 | Panagotacos et al. | 315/291 |
| 6,628,258 B1 | 9/2003 | Nakamura | |
| 6,639,574 B2 | 10/2003 | Scheibe | |
| 6,729,054 B1 | 5/2004 | VanderTuin | |
| 6,736,512 B2* | 5/2004 | Balogh | 353/7 |
| 6,809,390 B2 | 10/2004 | Toda et al. | |
| 6,819,303 B1 | 11/2004 | Berger et al. | |
| 6,842,164 B2 | 1/2005 | Imajo et al. | |
| 6,856,303 B2 | 2/2005 | Kowalewski | |
| 6,888,304 B2 | 5/2005 | Sato | |
| 7,049,983 B2 | 5/2006 | Azami et al. | |
| 7,058,250 B2* | 6/2006 | Bachl et al. | 385/15 |
| 7,070,311 B2* | 7/2006 | Lee | 362/545 |
| 7,091,927 B1* | 8/2006 | Hagge et al. | 345/1.3 |
| 7,148,944 B2 | 12/2006 | Kinoshita et al. | |
| 7,161,558 B1 | 1/2007 | Eidem et al. | |
| 7,165,863 B1 | 1/2007 | Thomas et al. | |
| 7,295,362 B2 | 11/2007 | Meisburger | |
| 7,417,251 B2 | 8/2008 | Iketsu et al. | |
| 7,443,028 B2 | 10/2008 | Satou et al. | |
| 7,475,356 B2 | 1/2009 | Baudisch et al. | |
| 7,492,091 B2 | 2/2009 | Kharrazi-olsson et al. | |
| 7,868,903 B2* | 1/2011 | Wendler et al. | 345/619 |
| 7,893,948 B1 | 2/2011 | Mittan et al. | |
| 8,001,455 B2 | 8/2011 | Gloege et al. | |
| 8,106,923 B2 | 1/2012 | Mittan et al. | |
| 8,344,410 B2 | 1/2013 | Wendler et al. | |
| 8,363,038 B2 | 1/2013 | Mittan et al. | |
| 8,552,928 B2* | 10/2013 | Wendler et al. | 345/33 |
| 8,552,929 B2 | 10/2013 | Mittan et al. | |
| 8,604,509 B2 | 12/2013 | Wendler et al. | |
| 2001/0015709 A1 | 8/2001 | Imajo et al. | |
| 2001/0049893 A1 | 12/2001 | Maas et al. | |
| 2002/0000576 A1 | 1/2002 | Inukai | |
| 2002/0051356 A1 | 5/2002 | Takahashi et al. | |
| 2002/0088984 A1 | 7/2002 | Toda et al. | |
| 2002/0122134 A1* | 9/2002 | Kalua | 348/383 |
| 2002/0145392 A1 | 10/2002 | Hair et al. | |
| 2002/0190987 A1 | 12/2002 | Travers et al. | |
| 2003/0031032 A1 | 2/2003 | Wu et al. | |
| 2003/0034497 A1 | 2/2003 | Yamazaki et al. | |
| 2003/0057886 A1 | 3/2003 | Lys et al. | |
| 2003/0067437 A1 | 4/2003 | McClintock et al. | |
| 2003/0071826 A1 | 4/2003 | Goertzen | |
| 2003/0076281 A1 | 4/2003 | Morgan et al. | |
| 2003/0209714 A1 | 11/2003 | Taskar et al. | |
| 2004/0004827 A1 | 1/2004 | Guest | |
| 2004/0041800 A1 | 3/2004 | Daniels | |
| 2004/0043139 A1 | 3/2004 | Daniels | |
| 2004/0080262 A1 | 4/2004 | Park et al. | |
| 2004/0207581 A1 | 10/2004 | Miller | |
| 2004/0235227 A1 | 11/2004 | Kawase | |
| 2004/0239586 A1 | 12/2004 | Cok | |
| 2004/0253896 A1 | 12/2004 | Yamazaki | |
| 2005/0030321 A1 | 2/2005 | Anwar | |
| 2005/0040962 A1 | 2/2005 | Funkhouser et al. | |
| 2005/0046646 A1 | 3/2005 | Tobita | |
| 2005/0064685 A1 | 3/2005 | Hayakawa | |
| 2005/0194898 A1 | 9/2005 | Kharrazi-Olsson et al. | |
| 2005/0225976 A1* | 10/2005 | Zampini et al. | 362/227 |
| 2005/0236640 A1 | 10/2005 | Guenther et al. | |
| 2006/0039142 A1 | 2/2006 | Temple | |
| 2006/0063027 A1 | 3/2006 | Vestweber et al. | |
| 2006/0221599 A1 | 10/2006 | Hornsby et al. | |
| 2006/0284161 A1 | 12/2006 | Tokida | |
| 2007/0099401 A1 | 5/2007 | Tanaka | |
| 2007/0148793 A1 | 6/2007 | Yoshida | |
| 2008/0225143 A1 | 9/2008 | Joffer et al. | |
| 2009/0021497 A1 | 1/2009 | Wendler et al. | |
| 2009/0021529 A1 | 1/2009 | Wendler et al. | |
| 2009/0021532 A1 | 1/2009 | Gloege et al. | |
| 2009/0024867 A1 | 1/2009 | Gloege et al. | |
| 2009/0024929 A1 | 1/2009 | Gloege et al. | |
| 2009/0184984 A1 | 7/2009 | Takahara | |
| 2009/0195154 A1 | 8/2009 | Yamazaki et al. | |
| 2010/0265277 A1 | 10/2010 | Takahara | |
| 2010/0277401 A1 | 11/2010 | Takahara et al. | |
| 2011/0102307 A1 | 5/2011 | Wendler et al. | |
| 2011/0141139 A1 | 6/2011 | Mittan et al. | |
| 2012/0005563 A1 | 1/2012 | Gloege et al. | |
| 2012/0032159 A1 | 2/2012 | Yamazaki et al. | |
| 2012/0120033 A1 | 5/2012 | Mittan et al. | |
| 2013/0002634 A1 | 1/2013 | Wendler et al. | |
| 2013/0120395 A1 | 5/2013 | Mittan et al. | |

FOREIGN PATENT DOCUMENTS

| | | |
|---|---|---|
| EP | 0390479 A2 | 10/1990 |
| EP | 1655712 A2 | 5/2006 |
| GB | 2164189 | 3/1986 |

(56) References Cited

FOREIGN PATENT DOCUMENTS

| GB | 2164189 A | 3/1986 |
|---|---|---|
| JP | 11191494 | 7/1999 |
| JP | 2005224983 A2 | 8/2005 |
| WO | WO-02/073298 A2 | 9/2002 |
| WO | WO-02/122134 A1 | 9/2002 |
| WO | WO-03/060857 A1 | 7/2003 |

OTHER PUBLICATIONS

"U.S. Appl. No. 10/965,133, Final Office Action mailed Nov. 17, 2009", 9 pgs.
"U.S. Appl. No. 10/965,133, Non Final Office Action mailed May 25, 2010", 10 pgs.
"U.S. Appl. No. 10/965,133, Non Final Office Action mailed Jun. 2, 2008", 5 pgs.
"U.S. Appl. No. 10/965,133, Non Final Office Action mailed Jul. 10, 2006", 5 pgs.
"U.S. Appl. No. 10/965,133, Non Final Office Action mailed Oct. 26, 2007", 6 pgs.
"U.S. Appl. No. 10/965,133, Notice of Allowance mailed Oct. 18, 2010", 7 pgs.
"U.S. Appl. No. 10/965,133, Response filed Jan. 10, 2007 to Non Final Office Action mailed Jul. 10, 2006", 9 pgs.
"U.S. Appl. No. 10/965,133, Response filed Feb. 14, 2008 to Non Final Office Action mailed Oct. 26, 2007", 16 pgs.
"U.S. Appl. No. 10/965,133, Response filed May 17, 2010 to Final Office Action mailed Nov. 17, 2009", 11 pgs.
"U.S. Appl. No. 10/965,133, Response filed Jun. 2, 2009 to Non Final Office Action mailed Jun. 2, 2008", 13 pgs.
"U.S. Appl. No. 10/965,133, Response filed Aug. 25, 2010 to Non Final Office Action mailed May 25, 2010", 8 pgs.
"U.S. Appl. No. 11/805,513, Advisory Action mailed Mar. 22, 2011", 3 pgs.
"U.S. Appl. No. 11/805,513, Final Office Action mailed Dec. 28, 2010", 11 pgs.
"U.S. Appl. No. 11/805,513, Non-Final Office Action mailed Apr. 28, 2010", 10 pgs.
"U.S. Appl. No. 11/805,513, Notice of Allowance mailed Apr. 6, 2011", 9 pgs.
"U.S. Appl. No. 11/805,513, Response filed Feb. 28, 2011 to Final Office Action mailed Dec. 28, 2010", 9 pgs.
"U.S. Appl. No. 11/805,513, Response filed Mar. 28, 2011 to Final Office Action mailed Dec. 28, 2010", 6 pgs.
"U.S. Appl. No. 11/805,513, Response filed Sep. 28, 2010 to Non Final Office Action mailed Apr. 28, 2010", 6 pgs.
"U.S. Appl. No. 11/895,423, Amendment filed Dec. 12, 2012", 29 pgs.
"U.S. Appl. No. 11/895,423, Notice of Allowance mailed May 9, 2012", 7 pgs.
"U.S. Appl. No. 11/895,423, Response filed May 2, 2012 to Restriction Requirement mailed Apr. 2, 2012", 17 pgs.
"U.S. Appl. No. 11/895,423, Restriction Requirement mailed Apr. 2, 2012", 5 pgs.
"U.S. Appl. No. 11/895,424, Non Final Office Action mailed Mar. 12, 2010", 6 pgs.
"U.S. Appl. No. 11/895,424, Notice of Allowance mailed Sep. 10, 2010", 13 pgs.
"U.S. Appl. No. 11/895,424, Response filed Jun. 11, 2010 to Non Final Office Action mailed Mar. 12, 2010", 8 pgs.
"U.S. Appl. No. 12/987,584, Advisory Action mailed Dec. 21, 2012", 2 pgs.
"U.S. Appl. No. 12/987,584, Final Office Action mailed Oct. 12, 2012", 21 pgs.
"U.S. Appl. No. 12/987,584, Non Final Office Action mailed Jun. 6, 2012", 19 pgs.
"U.S. Appl. No. 12/987,584, Notice of Allowance mailed May 31, 2013", 10 pgs.
"U.S. Appl. No. 12/987,584, Preliminary Amendment filed Feb. 28, 2011", 7 pgs.
"U.S. Appl. No. 12/987,584, Response filed Jan. 9, 2013 to Final Office Action mailed Oct. 12, 2012 and Advisory Action mailed Dec. 21, 2012", 12 pgs.
"U.S. Appl. No. 12/987,584, Response filed Sep. 6, 2012 to Non Final Office Action mailed Jun. 6, 2012", 12 pgs.
"U.S. Appl. No. 12/987,584, Response filed Dec. 12, 2012 to Final Office Action mailed Oct. 12, 2012", 12 pgs.
"U.S. Appl. No. 13/031,400, Response filed Jul. 13, 2011 to Non Final Office Action mailed Apr. 14, 2011", 12 pgs.
"U.S. Appl. No. 13/031,400, Non Final Office Action mailed Apr. 14, 2011", 18 pgs.
"U.S. Appl. No. 13/031,400, Notice of Allowance mailed Sep. 23, 2011", 7 pgs.
"U.S. Appl. No. 13/360,187, Non Final Office Action mailed Jun. 15, 2012", 20 pgs.
"U.S. Appl. No. 13/360,187, Notice of Allowance mailed Sep. 17, 2012", 7 pgs.
"U.S. Appl. No. 13/360,187, Response filed Sep. 4, 2012 to Non Final Office Action mailed Jun. 15, 2012", 19 pgs.
"U.S. Appl. No. 13/360,187, Response filed Sep. 4, 2012 to Non-Final Office Action mailed Jun. 15, 2012", 7 pgs.
"U.S. Appl. No. 13/609,647, Notice of Allowance mailed Aug. 7, 2013", 8 pgs.
"U.S. Appl. No. 13/732,510, Notice of Allowance mailed Jun. 5, 2013", 9 pgs.
"European Application Serial No. 08795482.2, Office Action mailed Feb. 21, 2012", 27 pgs.
"European Application Serial No. 05256403.6, European Search Report mailed Oct. 5, 2006", 12 pgs.
"European Application Serial No. 05256403.6, Partial European Search Report dated Jun. 20, 2006", 4 pgs.
"European Application Serial No. 08165441.0, European Search Report dated Mar. 16, 2009", 5 pgs.
"European Application Serial No. 08165441.0, Response filed Sep. 27, 2010, Office Action Jan. 27, 2012", 20 pgs.
"European Application Serial No. 08795477.2, Amended Claims filed May 6, 2010", 5 pgs.
"European Application Serial No. 08795477.2, Office Action mailed Mar. 31, 2010", 1 pg.
"European Application Serial No. 08795477.2, Office Action mailed Jul. 2, 2012", 6 pgs.
"European Application Serial No. 08795477.2, Response filed Nov. 2, 2012 to Office Action mailed Jul. 2, 2012", 12 pgs.
"European Application Serial No. 08795482.2, Examination Report mailed Sep. 13, 2011", 12 pgs.
"European Application Serial No. 08795482.2, Extended European Search Report mailed Jan. 19, 2011", 12 pgs.
"European Application Serial No. 08795482.2, Response filed Jan. 4, 2012 to Office Action mailed Sep. 13, 2011", 12 pgs.
"European Application Serial No. 08795482.2, Response filed Aug. 2, 2011 to Communication dated Feb. 7, 2011", 14 pgs.
"European Application Serial No. 09250303.6, European Search Report mailed Mar. 16, 2009", 5 pgs.
"European Application Serial No. 08795477.2, Response filed Aug. 31, 2011 to Supplementary European Search Report mailed Apr. 18, 2011", 11 pgs.
"European Application Serial No. 08795477.2, Supplementary European Search Report mailed Apr. 18, 2011", 7 pgs.
"International Application Serial No. PCT/US08/09936, International Preliminary Report on Patentability mailed Aug. 24, 2010", 6 pgs.
"International Application Serial No. PCT/US08/09936, International Search Report mailed Nov. 10, 2008", 1 pg.
"International Application Serial No. PCT/US08/09936, Written Opinion mailed Nov. 10, 2008", 3 pgs.
"International Application Serial No. PCT/US08/09941, International Search Report mailed Nov. 17, 2008", 1 pg.
"International Application Serial No. PCT/US08/09941, Written Opinion mailed Nov. 17, 2008", 6 pgs.
Baumann, P., "Management of Multidimensional Discrete Data", VLDB Journal, 3, (May 1994), 401-444 Matkovic, K., "Tone Mapping Techniques and Color Image Difference in Global Illumination", Dissertation, (Feb. 18, 1998), 128 pgs.

(56) References Cited

OTHER PUBLICATIONS

Schwesig, C., et al., "Gummi: A Bendable Computer", Proceedings of the SIGCHI conference on Human factors in computing systems CHI '04, (Apr. 2004), 263-270.

Van Baar, J., et al., "Seamless Multi-Projector Display on Curved Screens", Proceedings of the Workshop on Virtual Environments 2003 EGVE '03, (May 2003), 281-286.

"U.S. Appl. No. 10/965,127, Non Final Office Action mailed Aug. 8, 2007", 6 pgs.

"U.S. Appl. No. 10/965,133, Examiner Interview Summary mailed Aug. 30, 2010", 3 pgs.

U.S. Appl. No. 13/172,102, Non Final Office Action mailed Sep. 11, 2014, 21 pgs.

European Application Serial No. 08165441.0, Examination Notification Art. 94(3) mailed Aug. 22, 2014, 4 pgs.

* cited by examiner

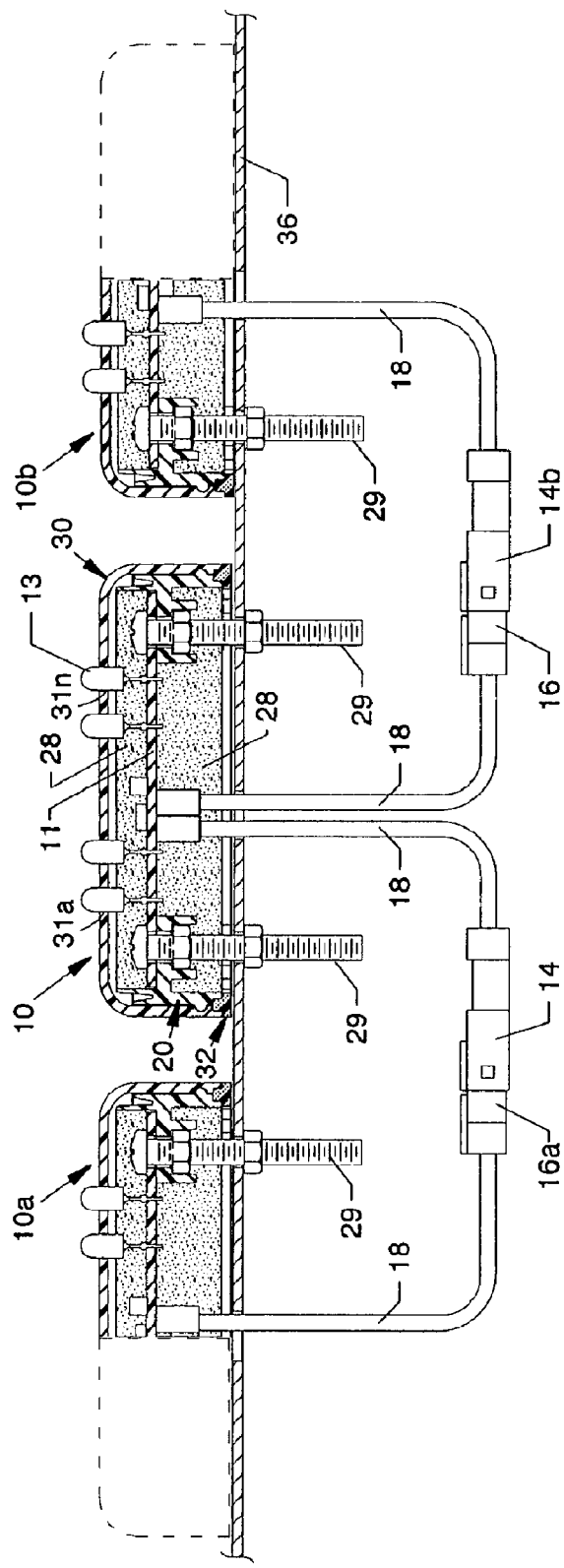

SEALED PIXEL ASSEMBLIES, KITS AND METHODS

CROSS-REFERENCE TO RELATED APPLICATIONS

This application is a continuation of and claims priority to U.S. patent application Ser. No. 12/987,584, filed Jan. 10, 2011, entitled "SEALED PIXEL ASSEMBLIES, KITS AND METHODS," which is a continuation of and claims priority to U.S. patent application Ser. No. 11/895,424, filed Aug. 24, 2007, assigned U.S. Pat. No. 7,868,903, entitled "FLEXIBLE PIXEL ELEMENT FABRICATION AND SEALING METHOD." U.S. patent application Ser. No. 11/895,424 claims priority from U.S. Provisional Application No. 60/926,706 filed Apr. 27, 2007, entitled "FLEXIBLE PIXEL ASSEMBLIES FOR MOUNTING ON IRREGULAR SURFACES," and is a continuation-in-part of U.S. patent application Ser. No. 10/965,133 filed Oct. 14, 2004, entitled "FLEXIBLE PIXEL STRING HARDWARE AND METHOD," assigned U.S. Pat. No. 7,893,948, the entirety of each of the disclosures of which are explicitly incorporated by reference herein.

This application is also related to U.S. patent application Ser. No. 10/965,127 filed Oct. 14, 2004, entitled "FLEXIBLE PIXEL STRING SOFTWARE AND METHOD", now abandoned, U.S. patent application Ser. No. 11/805,513 filed May 23, 2007, entitled "TRANSLATION TABLE," assigned U.S. Pat. No. 8,001,455, and U.S. patent application Ser. No. 11/895,423 filed Aug. 24, 2007, entitled "FLEXIBLE PIXEL ELEMENT AND SIGNAL DISTRIBUTION MEANS," assigned U.S. Pat. No. 8,344,410, the entirety of each of the disclosures of which are explicitly incorporated by reference herein.

TECHNICAL FIELD

The present invention teaches a discrete flexible pixel assembly for use in flexible pixel strings and, more particularly, a fabrication method and means for hermetic sealing of discrete flexible pixel assemblies.

Flexible pixel assemblies may be used in large scale, direct view electronic display devices and signage mounted on large area and/or irregular surfaces, such as the interior or exterior of buildings, where the intent is to complement the surface architecture of the building by conforming to the building surfaces. A particular problem arises with electronic display devices used in outdoor or exterior displays such as signs since delicate electronic components in such displays are exposed to the detrimental effects of environment, rough handling and inclement weather and are therefore vulnerable to failure. The discrete flexible pixel assembly, fabrication method and means for hermetic sealing of the present invention precludes failure of electronic components due to the detrimental effects of environment, thereby enabling efficient, economical production of large scale, direct view electronic display devices, signage and lighting effects for outdoor use.

BACKGROUND

Electronic display devices and signage are known in the art. An electronic display device typically comprises a display board that produces visual images by means of a grid of small light emitting elements, such as incandescent bulbs, LEDs, or the like; data handling and control means for managing transfer of digital image data for display as visual output images, and means for converting digital image data into visual image data and display control signals to drive the light emitting elements, or pixels, to thereby produce visual output images on the electronic display devices for viewing.

The sophistication of visual images that can be displayed on electronic display devices is generally dependent on the capabilities of the light emitting elements, or pixels, used to produce visual images. Light emitting display technology has become increasingly more advanced in the art, progressing from monochrome incandescent and LED devices to video quality components capable of exhibiting near continuous tone visual output, complex animations and live video streams. Improvements in light emitting display technology, including light emitting elements, have in turn enabled the manufacture of electronic display devices that are increasingly large in scale and more powerful in terms of the complexity and sophistication of the visual output images that can be displayed.

Electronic display devices and signage sited in outdoor locations, such as on the exterior surfaces of buildings, are also known in the art. Outdoor electronic display devices and signage are commonly sited near public venues where the visual output images they exhibit may be viewed simultaneously by large numbers of people in groups. Outdoor electronic display devices provide a valuable service to the public since they can provide timely or time-critical information, such as stock and commodity prices, traffic and weather conditions, hazard alerts, and other important information. One popular type of outdoor electronic display device is a large scale video for advertising displays and signage where commercial messages are broadly and effectively exhibited for public viewing.

An inherent problem in the design and manufacture of large scale electronic display devices for outdoor use is the need to protect delicate and vulnerable internal electronic components from failure due to the detrimental effects of environment. This problem is exacerbated by the increasing sophistication of light emitting elements and their collateral support electronics, such as the electronic drivers for the light emitting elements. In the early art, incandescent bulbs served as light emitting elements. Incandescent bulbs are comparatively inexpensive to use, robust in operation and easy to replace; moreover, they require few and comparatively inexpensive collateral support electronics and power and signal conductors. More advanced light emitting elements or pixels, such as LEDs and LCDs, are more expensive to use and replace. In addition, they require more numerous and more expensive collateral support electronics, including pixel element drivers, data buffers, control signal handlers, over-voltage and transient protection circuits, to name a few. Furthermore, advanced light emitting elements and collateral support electronics are comparatively much more delicate and easily damaged by electrostatic shock, thermal shock, mechanical shock, moisture and humidity, and various other detrimental environmental conditions. Advanced light emitting elements and collateral support electronics also require more sophisticated means of mounting and electrical connection, such as surface mounted printed circuit boards (PCBs), as well as more sophisticated means of supplying operating power, digital image data and display control signals, which means greatly increase the number of signal paths and conductors needed to service components and thereby greatly increase the number of connection points and potential points of failure. Therefore, the use of advanced light emitting elements, while presenting advantages in terms of the sophistication of visual output images that can be displayed, also presents a vulnerable design architecture with many potential points of failure.

In the prior art, light emitting elements are collectively sealed within enclosures to protect them from the outside environment. Not only does this add to the cost of producing already expensive large scale outdoor electronic displays and signage, but such enclosures are generally effective only for conventional, rectilinear or planar displays mounted on flat surfaces. Producing collective enclosures that conform to irregular shaped surfaces can be a complex and costly undertaking. Moreover, a collective enclosure typically embodies a single-point failure mode, wherein any failure of the collective enclosure exposes all the light emitting elements, collateral support electronics and connection points contained therein to potential failure. Finally, collective enclosures are subject to overheating from both internal and external sources, including component power dissipation and solar radiation.

A solution to some of these problems is taught in co-pending U.S. patent application Ser. No. 11/895,423 entitled "FLEXIBLE PIXEL ELEMENT AND SIGNAL DISTRIBUTION MEANS." A portion of that teaching is the use of a plurality of discrete flexible pixel elements that can be interchangeably connected in series by means of flexible cables to produce flexible pixel strings that are conformable to irregular shapes and surfaces.

The present invention further discloses means and methods that are operative and efficacious in manufacturing discrete flexible pixel elements, including a fabrication method and means for encapsulating pixel element electronics, such as light emitting elements and collateral support electronics, and encasing the encapsulated pixel element electronics in an external top encasement cover in order to produce a unitary, hermetically sealed, self-contained module that is protected from the detrimental effects of the environment. The present invention also discloses means for connecting power and signal cables to a plurality of discrete flexible pixel elements in series connection, whereby electrical conductors and contacts within power and signal cables are similarly protected.

In summation, the prior art is generally dependent on conventional means, such as collective enclosures, to protect pixel element electronics used in electronic display devices sited outdoors from preventable failure and damage. Conventional collective enclosures are not well suited for protecting electronic display devices that conform to irregular shapes and surfaces since they are difficult and expensive to fabricate. Furthermore, they embody a single point failure mode which exposes all internal components and connections to potential failure, as well as being subject to overheating. As a result, production of such enclosures is cost prohibitive, while outcomes are often inelegant and failure prone. A novel approach to address the aforesaid deficiencies of the prior art is needed to continue to satisfy public demand and thereby ensure continuing development of the art.

SUMMARY

The general purpose of the present invention is to protect delicate and vulnerable pixel element electronics used in discrete flexible pixel elements from failure and damage due to detrimental effects of environment. More specifically, the present invention discloses a fabrication method and means for hermetic sealing of pixel element electronics embodied within discrete flexible pixel elements. The fabrication method comprises an encapsulation means and an external casement means. In addition, the fabrication method embodies connection means for connecting power and signal cables conjoining a plurality of discrete flexible pixel elements in series-connection, wherein electrical conductors and terminal contacts embodied within said power and signal cables are similarly protected.

The encapsulation means may include the use of a potting resin or gel that encapsulates said pixel element electronics and hardens on exposure to the atmosphere, heat, or a reactive agent such as a hardener. Alternatively, the encapsulation means may include the use of a ductile foam or malleable solid potting material having similar protective properties in application and which harden by similar processes to achieve similar results.

External casement means may embody a formed top encasement cover of plastic or similar material, wherein the top encasement cover has an internal cavity configured to receive encapsulated pixel element electronics in assembly. The formed top encasement cover may be transparent to pass light from light emitting elements or may have holes therein enabling the light emitting elements to protrude therefrom in order to pass light directly.

Alternatively, external casement means may embody a formed top encasement cover which has an internal cavity configured to receive pixel element electronics not yet encapsulated and which serves as a potting shell enabling pixel element electronics positioned therein to be encapsulated in situ.

In another alternative embodiment, external casement means may embody a formed top encasement cover which is formed around encapsulated pixel element electronics in a fused close fit therewith, such as by plastic forming or by an injection molding means.

In yet another alternative embodiment, the formed top encasement cover may have some corresponding fitting features adaptively to receive a barrier sealant means which may embody a ductile barrier sealant such as caulk or a malleable barrier sealant such as sealing lace or cord or a solid barrier sealant such as a sealing gasket or O-ring, wherein said corresponding fitting features engage the barrier sealant in a close fit therewith to establish a sealed barrier to atmosphere.

Connection means for connecting power and signal cables conjoining a plurality of discrete flexible pixel elements in series connection may embody formed cable connectors of plastic or similar material that house and mechanically support electrical conductors and terminal contacts, wherein said formed cable connectors and terminal contacts have corresponding fitting features which enable them to conjoin in a close mechanical fit to thereby establish series connections between a plurality of discrete flexible pixel elements, and wherein said close mechanical fit establishes a sealed barrier to the atmosphere.

According to one embodiment of the present invention, there is provided a fabrication method for hermetic sealing of pixel element electronics embodied within discrete flexible pixel elements which comprises an encapsulation means, an external casement means and a connection means for connecting power and signal cables.

According to another embodiment of the present invention, there is provided an encapsulation means that includes the use of a formed potting shell which has fitting features for receiving a pixel element electronics assembly, further presenting cavities for receiving potting material, thereby enabling the encapsulation of said pixel element electronics assembly through the introduction of the potting material, and further having fitting features for receiving components of said external casement means in a close fit therewith.

According to still another embodiment of the present invention, there is provided a potting resin or gel that encapsulates a pixel element electronics assembly which potting resin or gel hardens by exposure to the atmosphere or heat or by a reactive agent such as a hardener. The potting resin or gel is selected or formulated for optimal performance characteristics and properties efficacious for encapsulating pixel element electronics of discrete flexible pixel elements and protecting them from the detrimental effects of the environment.

According to yet another embodiment of the present invention, there is provided an external casement means which embodies a formed top encasement cover and formed bottom plate of plastic or similar material, wherein the formed top encasement cover has an internal cavity configured to receive the encapsulated pixel element electronics assembly and which further has fitting features to receive said formed bottom plate in close fit therewith, the formed top encasement cover having through holes therein to enable the light emitting elements to protrude therefrom.

According to still another embodiment of the present invention, there is provided connection means for connecting power and signal cables that embody formed connector headers of plastic or similar material which house and mechanically support electrical conductors and terminal contacts and which have fitting features enabling them to conjoin in a close mechanical fit, thereby establishing a sealed barrier to the environment.

A significant aspect and feature of the present invention is that the fabrication means which enables the hermetic sealing of delicate and vulnerable pixel element electronics contained within discrete flexible pixel elements in order to protect them from failure and damage due to the detrimental effects of the environment.

Another significant aspect and feature of the present invention is that the hermetically sealed discrete flexible pixel elements can better withstand the rough handling and mechanical shock during the shipping and assembly of electronic display devices and during required service and replacement thereof upon failure.

Yet another significant aspect and feature of the present invention is that the hermetically sealed discrete flexible pixel elements can better withstand inclement weather, moisture and humidity, electrostatic shock, thermal shock, and other detrimental effects of the environment, therefore they are better adapted for application in outdoor sites.

Still another significant aspect and feature of the present invention is that the hermetically sealed cable connectors and conductors supplying said pixel element electronics will protect the terminal connections from possible failure and damage due to rough handling and the detrimental effects of the environment.

A further significant aspect and feature of the present invention is that the hermetically sealed flexible discrete pixel elements do not require expensive collective enclosures thereby preventing individual failure of discrete flexible pixel elements and pixel element electronics embodied therein due to single-point failure of the enclosure.

A further significant aspect and feature of the present invention is that the hermetically sealed discrete flexible pixel elements will ensure greater longevity of pixel element electronics embodied therein and are more easily replaced upon failure.

A final significant aspect and feature of the present invention is that the fabrication method and means for hermetic sealing of discrete flexible pixel elements provide a robust design architecture, an improved cost-benefit in the design, manufacture and maintenance of large scale, direct view electronic display devices and signage for outdoor applications.

Having thus described embodiments of the present invention and setting forth significant aspects and features of the present invention, it is the principal object of the present invention to provide a discrete flexible pixel element that is hermetically sealed from the environment and embodied as a unitary, self-contained, replaceable module for efficient, economical production of large scale, free-form electronic displays, signs and lighting effects for outdoor applications. The present invention teaches a fabrication method for producing hermetically sealed discrete flexible pixel elements including means for encapsulating pixel element electronics, exterior casement means, and cable connector means.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 6A is a cross section side view of a plurality of discrete flexible pixel elements of the present invention in series connection with pixel element electronics assemblies therein fully encapsulated by potting material and attached to a planar mounting surface;

DETAILED DESCRIPTION

Figure 1:
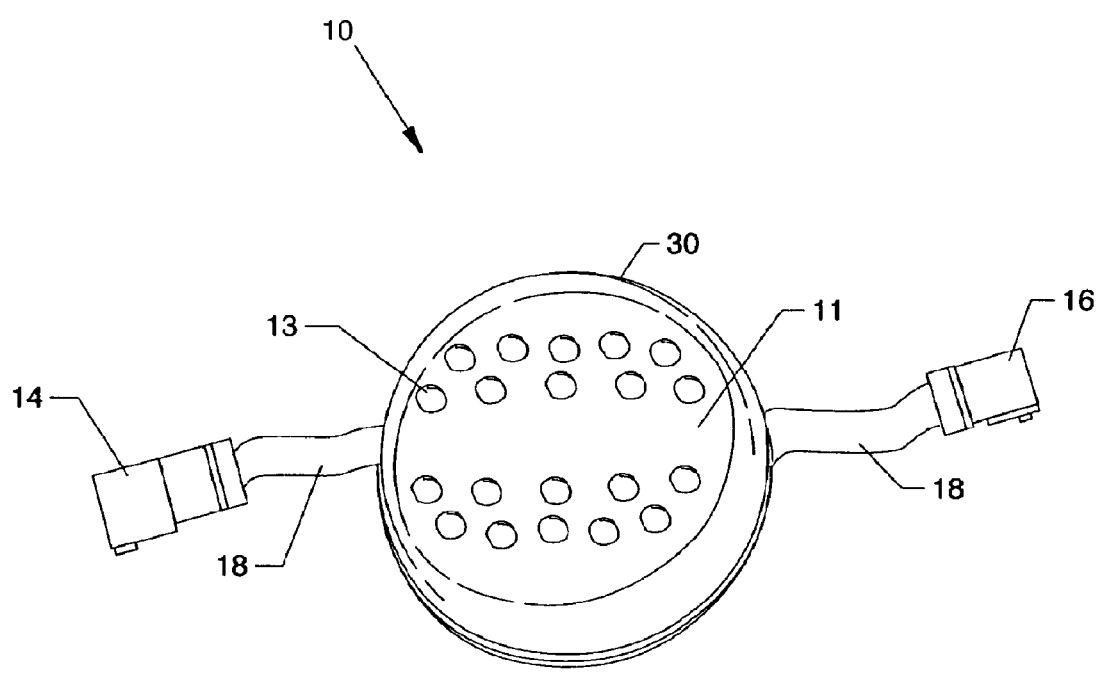
FIG. 1 is an isometric view showing a hermetically sealed discrete flexible pixel element of the present invention embodying a unitary, self-contained, replaceable module.

FIG. 1 is an isometric view of a preferred embodiment of discrete flexible pixel element 10 of the present invention. The flexible pixel element 10 embodies a printed circuit board assembly (not shown) on which various surface mounted electrical components are soldered or mechanically fastened to conductor pads by operative electrical connection including a plurality of light emitting elements 13, top encasement cover 30, input connector 14, output connector 16, and flexible cables 18 embodying in assembly a unitary, self-contained, replaceable module. The light emitting elements 13, or pixels, are illuminated when energized by on-board pixel element drivers (not shown) to produce a visual output in the form of emitted light. In a preferred embodiment, the light emitting elements 13 comprise a plurality of red, green and blue (RGB) colored LEDs.

Figure 2:
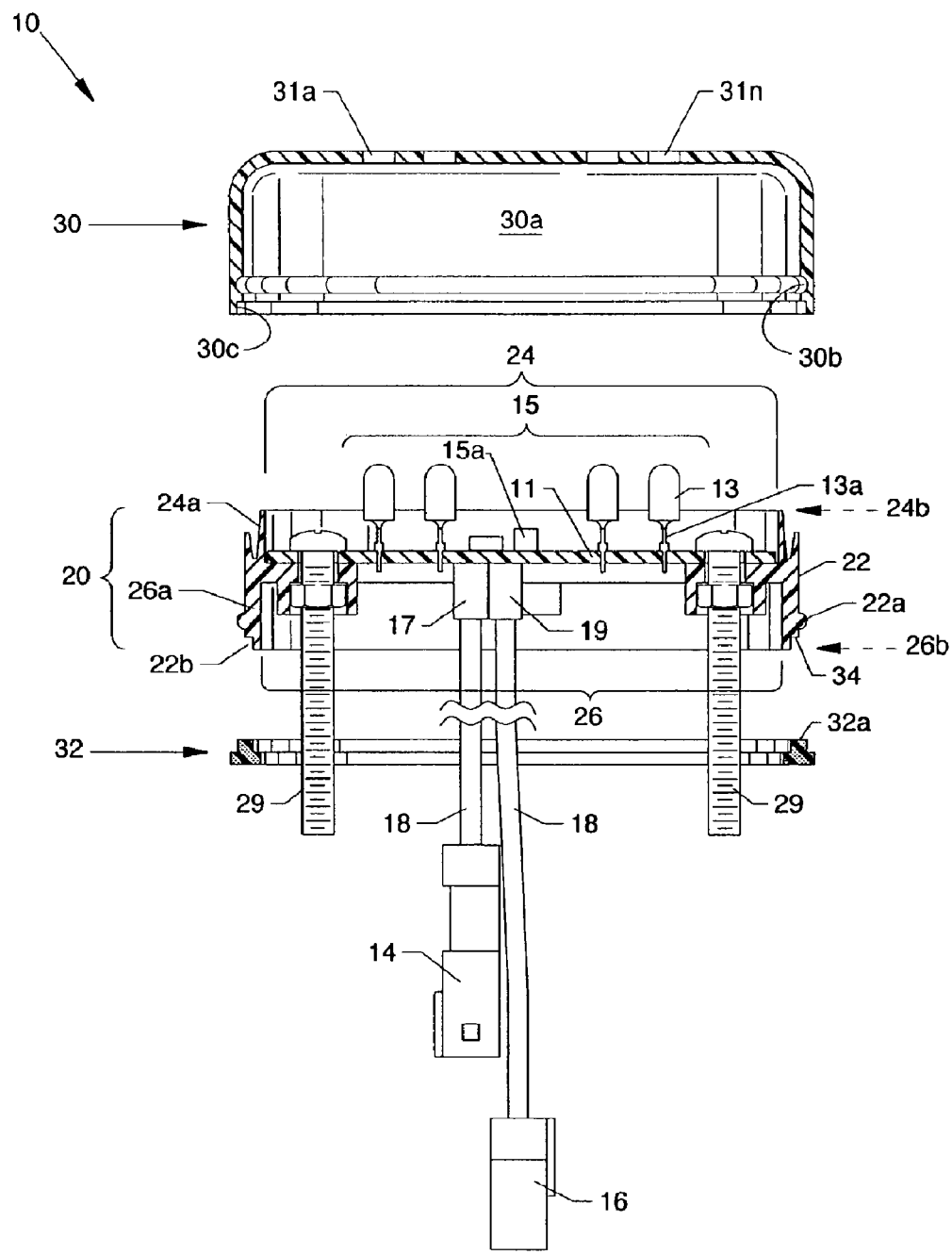
FIG. 2 is a cross section side view of a pixel element electronics assembly attached to a potting shell with fasteners.

FIG. 2 is a cross section side view of potting assembly 20, a top encasement cover 30, and a bottom gasket 32. Printed circuit board assembly 11 supports a plurality of surface mounted pixel element electronics 15, including light emitting elements 13 and pixel element drivers 15a, in addition to other collateral support electronics, such as resistors and capacitors (not shown), soldered or mechanically fastened to conductor pads by operative electrical connection. The printed circuit board assembly 11 is fastened to a potting shell 22 by mechanical fasteners 29 of sufficient length for attaching said discrete flexible pixel element 10 in finished assembly to a mounting surface or back-plate 36 (see FIGS. 6A and 6B) of an electronic display device. Potting shell 22 is a formed housing of plastic or similar material that presents an upper cavity 24 and lower cavity 26 for receiving potting material. Upper cavity 24 has an upper cavity wall 24a of sufficient height to enable said potting material to fill the upper cavity 24 to a cavity limit indicated by reference numeral 24b, thereby to fully cover a proximal lower portion of light emitting elements 13. The electrical conductors 13a of the light emitting elements 13, as well as the pixel element electronics 15, are completely encapsulated. However, the distal upper portions of the light emitting elements 13 are not encapsulated thus providing an unobstructed transmission of light from the flexible pixel element 10.

A lower cavity wall 26a has a sufficient height to enable potting material to fill the lower cavity 26 to a limit, indicated by reference numeral 26b, which is sufficient to fully cover flexible cable headers 17, 19 and a proximal portion of flexible cables 18, thereby fully encapsulating flexible cable headers 17, 19, as well as the underside of the printed circuit board assembly 11 and further providing strain relief to flexible cables 18.

Figure 3A:
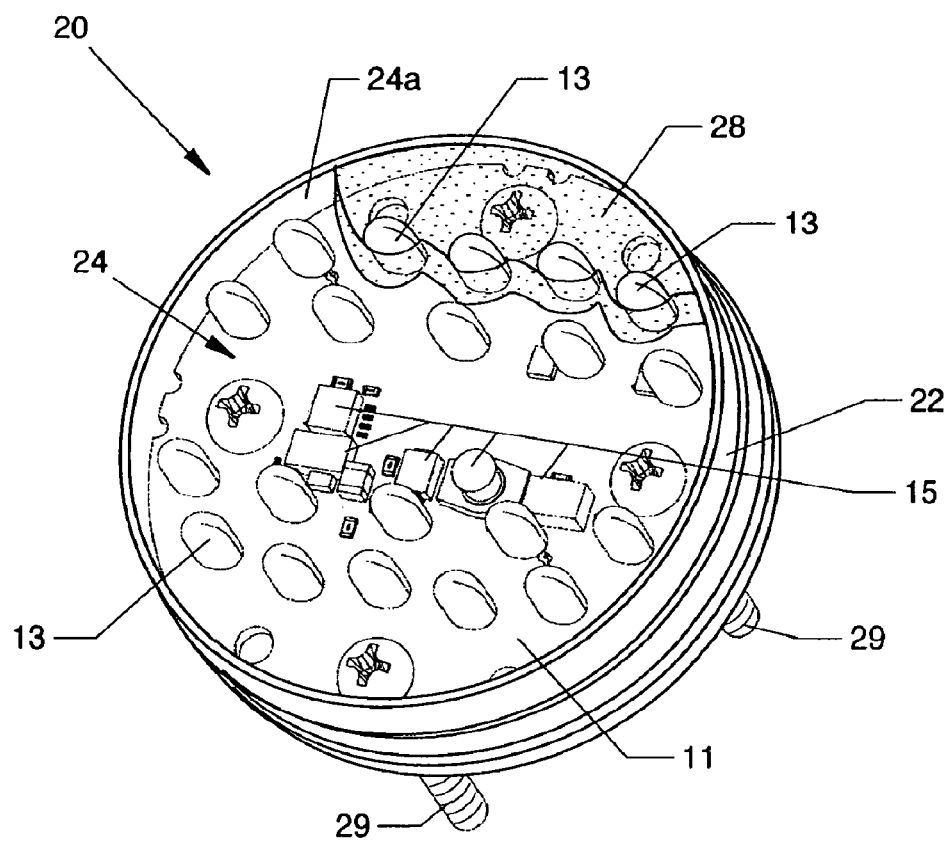
FIGS. 3A and 3B are isometric top and bottom views of a pixel element electronics assembly and potting shell in assembly with potting material being applied to upper and lower cavities in the potting shell.
Figure 3B:
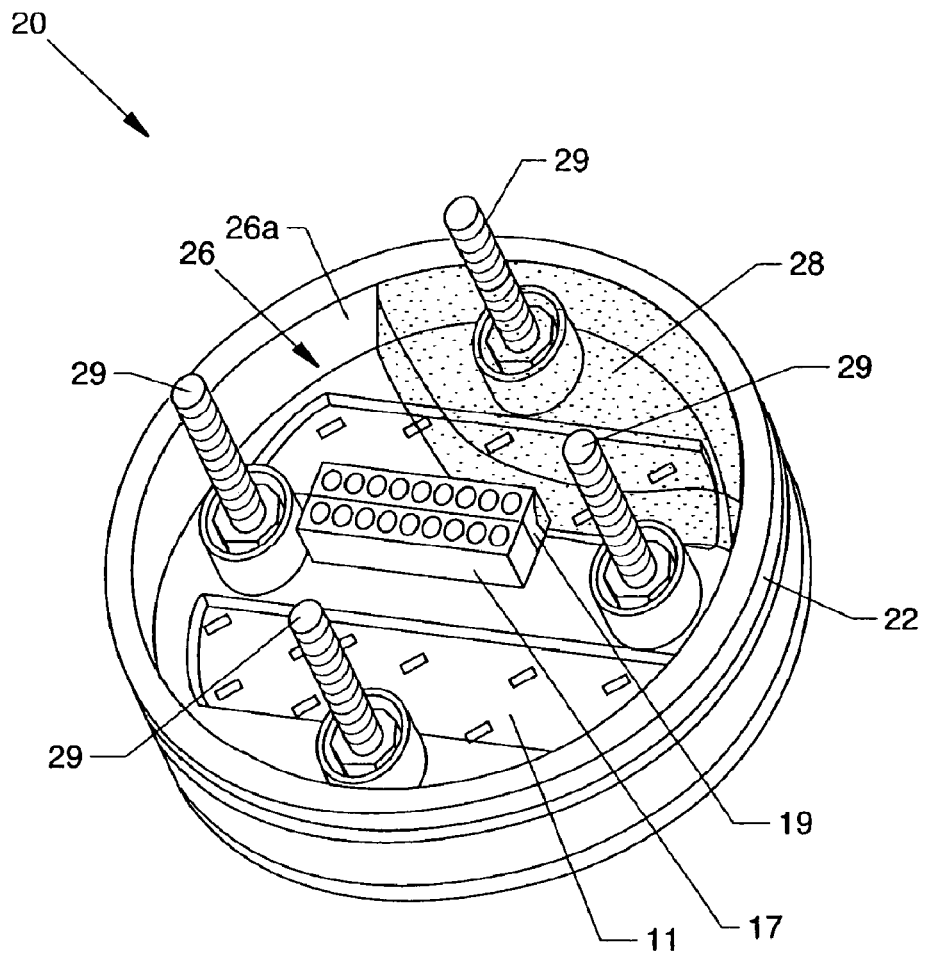

FIGS. 3A and 3B are top and bottom isometric views of potting assembly 20. A potting material 28 is applied in sufficient quantity (partially shown) to fill the upper cavity 24 of potting shell 22 to the upper limit of the interior cavity wall 24a without overflow and to fill the lower cavity 26 of potting shell 22 to the upper limit of interior cavity wall 26a without overflow. Potting material 28 may be any conventional potting material, such as epoxy or polyurethane potting compounds, having optimal performance characteristics and properties efficacious for encapsulating pixel element electronics 15 of discrete flexible pixel assembly 10, to-whit:

(1) potting material 28 is a thermally, chemically and electrically inert material that, when hardened, protects pixel element electronics 15 from moisture, humidity, solar radiation, atmospheric pressure changes, vacuum, corrosive chemicals, electrical shock, thermal shock, mechanical shock, and other detrimental environmental effects;

(2) potting material 28 is a viscous material with optimal flow properties for application in predetermined quantities for filling upper cavity 24 and lower cavity 26 of potting shell 22, either by manual application or by machine application, such as by a meter-mix-dispense (MMD) method, at optimal speed without overflow;

(3) potting material 28 is a sublimating material with optimal state change characteristics to enable rapid hardening, either by self-sublimation through exposure to atmosphere or by use of a hardening agent;

(4) potting material 28 is an adhesive material with optimal adhesion characteristics to fully bond with interior cavity walls 24a, 26a of potting shell 22 without requiring separate adhesion means;

(5) potting material 28 is a volumetrically stable material that exhibits minimum shrinkage after hardening;

(6) potting material 28 is a thermally conductive material with exothermic characteristics for transmitting heat generated by pixel element electronics 15 to the environment at a rate sufficient to prevent thermal overload;

(7) potting material 28 is a strong material when hardened and exhibits optimal compressive strength to enable mounting discrete flexible pixel assemblies by mechanical fasteners 29 without damage; and, (8) potting material 28 is a temperature resistant material when hardened and exhibits insensitivity to ambient temperature within an operating range optimal for use in outdoor applications of discrete flexible pixel elements 10 in electronic display devices.

Once applied, potting material 28 is allowed to harden in a state change sublimation by exposure to the atmosphere or through the use of a hardening agent, thereby completing encapsulation of pixel element electronics 15 within potting assembly 20.

Those skilled in the art will apprehend that the foregoing performance characteristics and properties of potting material 28 for use in discrete flexible pixel elements 10 involves various design choices and tradeoffs in the selection of optimal characteristics thereof. Accordingly, reference to the performance characteristics and properties of potting material 28 shall not be considered limiting in scope of the types and formulations of potting materials 28 that may efficaciously be used with discrete flexible pixel elements 10.

Figure 4:
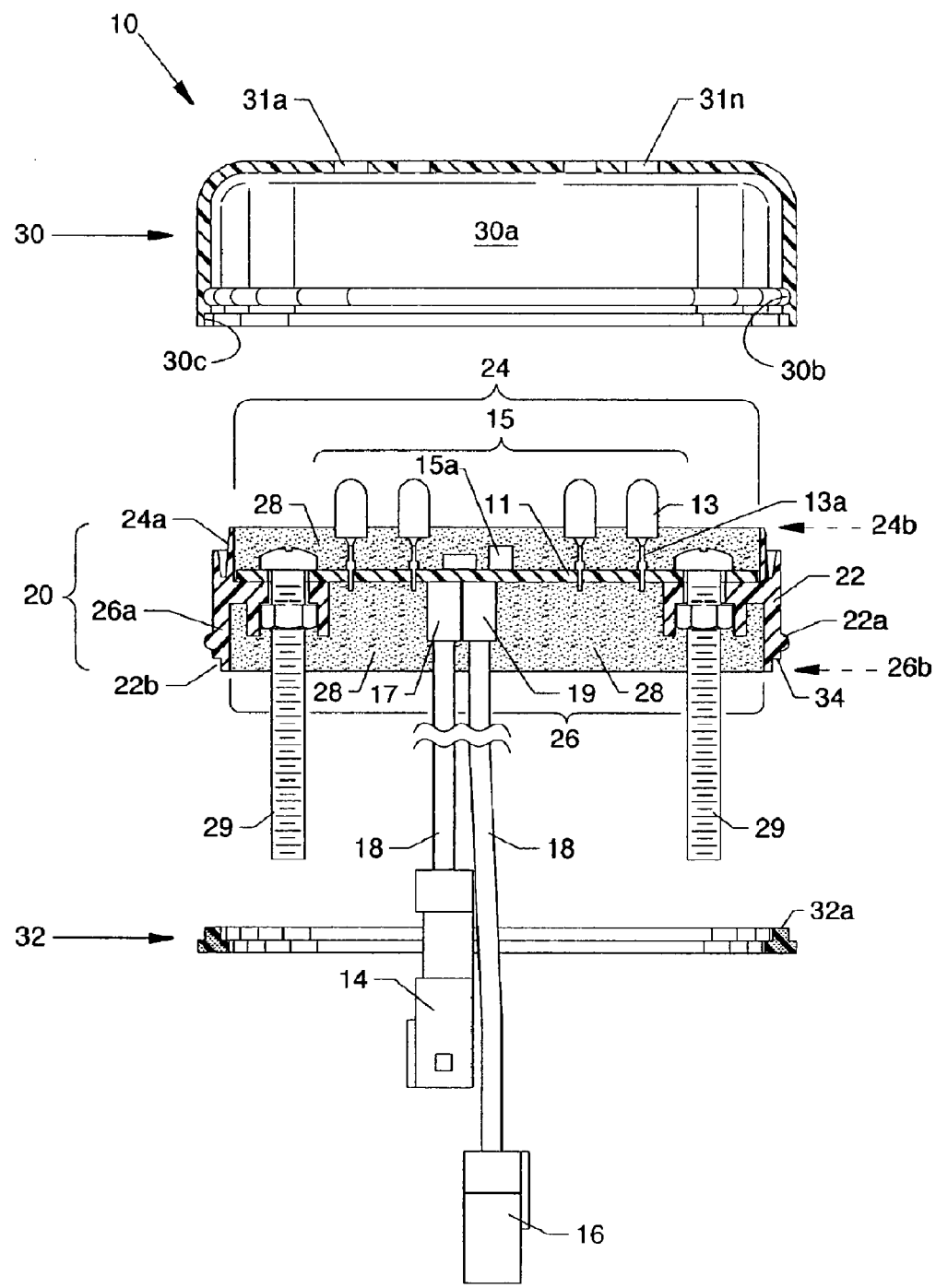
FIG. 4 is an isometric assembly view of a discrete flexible pixel element showing a pixel element electronics assembly and potting shell in assembly, top cover and bottom gasket.

FIG. 4 is an exploded isometric assembly view of a discrete flexible pixel element 10 showing potting assembly 20, top encasement cover 30, bottom gasket 32, and potting material 28 residing in the potting assembly 20. Top encasement cover 30 is a formed housing of an optically opaque plastic or similar material that has a cavity 30a of sufficient volume to operatively to receive an upper portion of potting assembly 20 therein and presenting a ring recess 30b within top encasement cover 30 for receiving a corresponding ring protrusion 22a of potting shell 22 enabling top encasement cover 30 to engage and conjoin potting shell 22 mechanically by snapping into place therewith. The top surface of the top encasement cover 30 also includes a plurality of holes 31a-31n for accommodating the partial protrusion of the light emitting elements 13.

Bottom gasket 32 is a formed pliable gasket of plastic, rubber or similar durable material that has a ring extension 32a corresponding to a ring recess 34 formed by a recess 22b in potting shell 22 and a corresponding recess 30c in top encasement cover 30 when mechanically conjoined, as heretofore described. Bottom gasket 32 mechanically engages ring recess 34 by inserting the ring extension 32a therein in order to effect a closure between the top encasement cover 30 at recess 30c and potting shell 22 at recess 22b.

Advantageously, top encasement cover 30 operatively engages with and conjoins potting shell 22, and bottom gasket 32 operatively engages with and conjoins both top encasement cover 30 and potting shell 22, by means of a mechanical fit and reliance on tension and compression forces without requiring the use of an adhesive or recourse to mechanical fasteners during assembly, thus reducing the cost of manufacture and further enabling recovery of the top encasement cover 30 and bottom gasket 32 on failure or damage of pixel element electronics 15.

Figure 5:
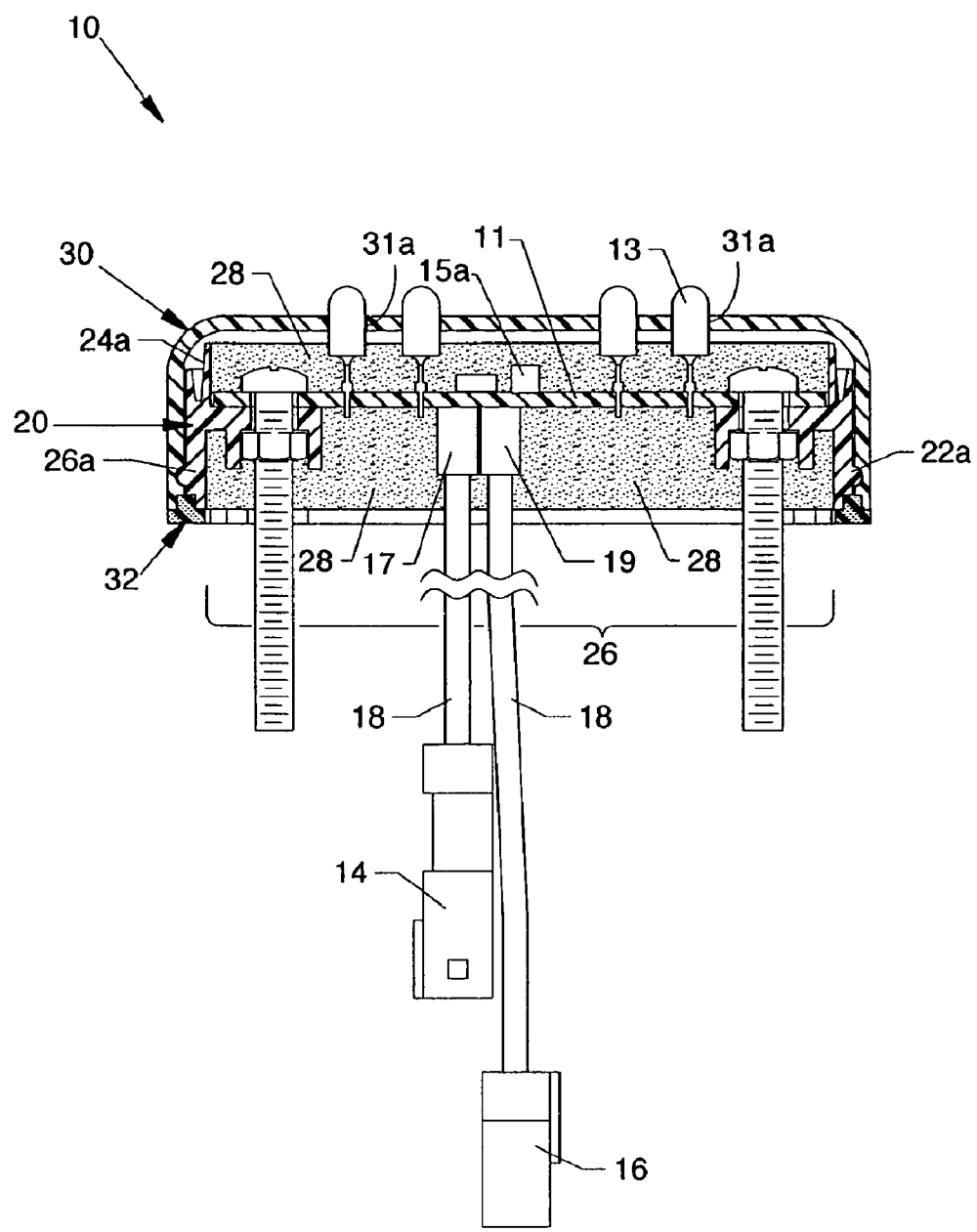
FIG. 5 is an assembled view of the components of FIG. 4.

FIG. 5 is an assembled view of the components of FIG. 4.

FIG. 6A is a cutaway assembly view of discrete flexible pixel element 10 showing potting assembly 20, potting material 28, top encasement cover 30, and bottom gasket 32 in final assembly embodying an hermetically sealed, unitary, self-contained replaceable module. As shown, a plurality of light emitting elements 13 protrudes through an equal plurality of through-holes 31a-31n in the top encasement cover 30 to present an upper portion of said plurality of light emitting elements 13 to the exterior side of top encasement cover 30 permitting an unobstructed transmission of light. Mechanical fasteners 29 may be fixedly attached to a mounting surface or to a back plate 36 of an electronic display device. Alternatively, mechanical fasteners 29 may be conjoined to a detachable footing (not shown) that allows discrete flexible pixel elements 10 to be positioned in a non-fixed condition. Input connector 14 engages with and mechanically conjoins output connector 16a of the previous series connected discrete flexible pixel element 10a. Output connector 16 engages with and mechanically conjoins input connector 14b of the next series connected discrete flexible pixel element 10b.

Figure 6B:
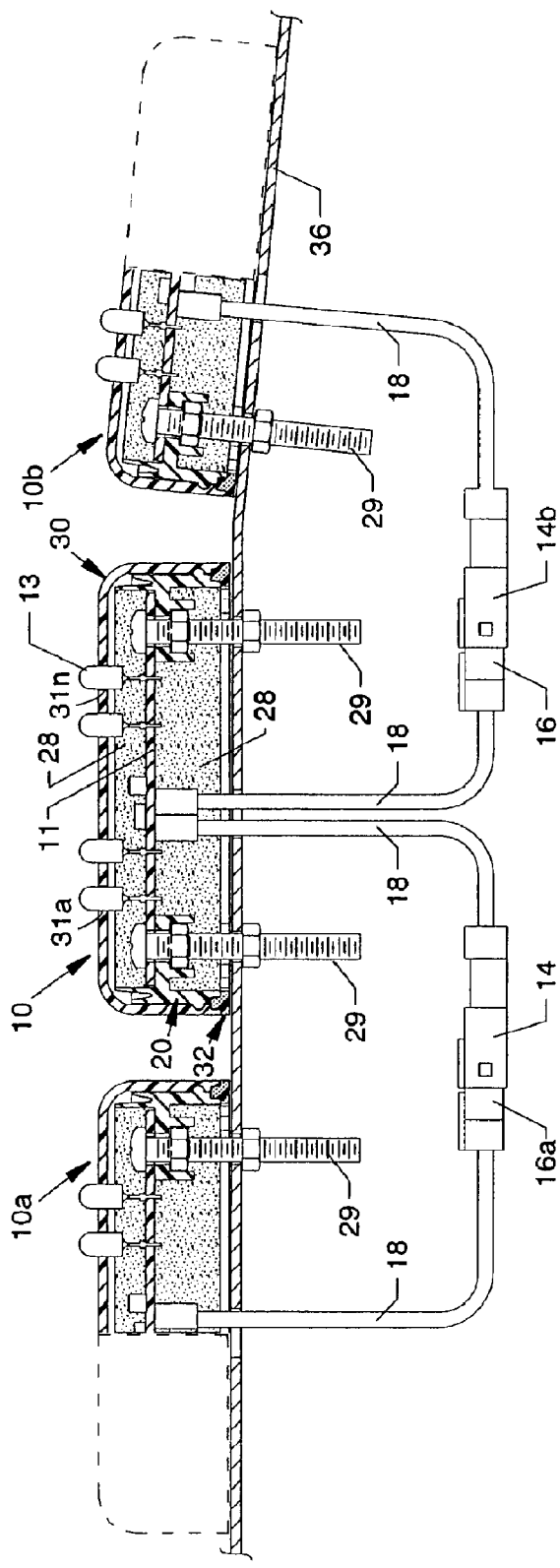
FIG. 6B is similar to FIG. 6A but with the plurality of discrete flexible pixel elements attached to a non-planar or irregular surface; and, FIG. 7 is a cross section side view of input and output cable connectors of discrete flexible pixel elements showing corresponding mating components and applied potting material.

FIG. 6B is a cutaway assembly view similar to FIG. 6A but with a string of discrete flexible pixel elements 10 attached to a non-planar or irregular mounting surface 36.

Figure 7:
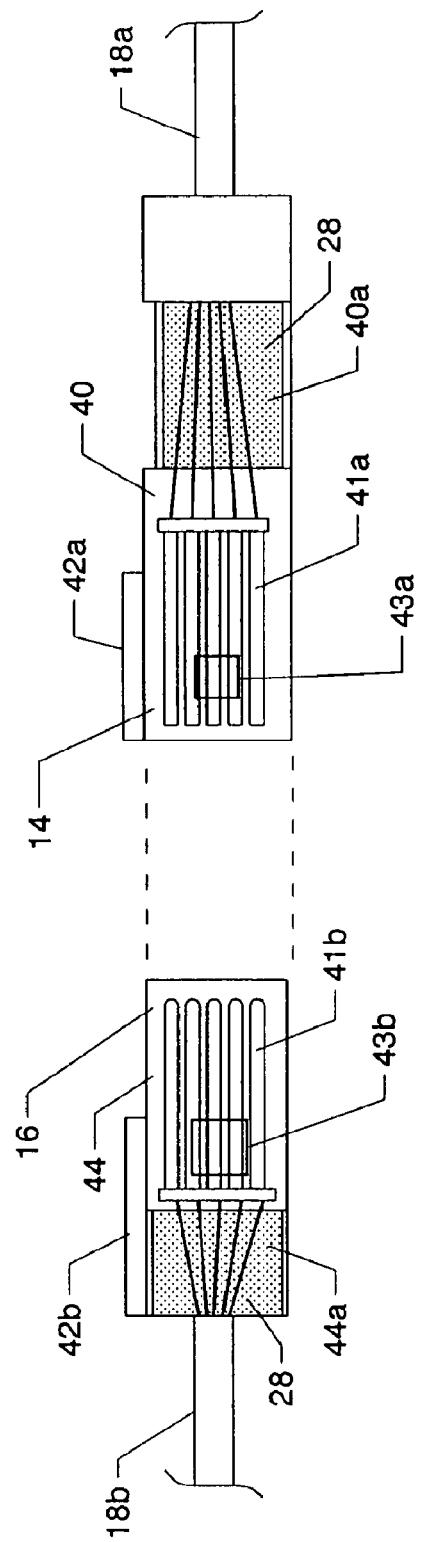

FIG. 7 is a cutaway assembly view of input connector 14 and output connector 16 showing internal components and corresponding fitment features enabling same to engage with and conjoin in closed mechanical fitment thereby to establish a sealed barrier to the atmosphere. Input connector shell 40 is a formed housing of plastic or similar electrically nonconductive material that supports a plurality of captive input terminal contacts 41a of flexible cable 18a. Similarly, output connector shell 44 is a formed housing of plastic or similar electrically nonconductive material that supports a plurality of captive output terminal contacts 41b of flexible cable 18b. An input connector key 42a mechanically engages with and conjoins a corresponding output connector key 42b. An input connector protrusion 43a mechanically engages with and conjoins a corresponding output connector recess 43b by snapping into place. Input connector 14 with input terminal contacts 41a mechanically engage with and conjoin output connector 16 with output terminal contacts 41b in operative electrical connection therewith. Potting material 28 is applied to cavity 40a of input connector housing 40 to encapsulate and seal flexible cable 18a and providing strain relief and potting material is similarly applied to cavity 44a of output connector housing 44 for the same purpose. Upon engagement and mechanical connection, the terminal contacts 41a of input connector 14 engage with corresponding terminal contacts 41b of output connector 16 in a close mechanical fit thereby effecting an operative electrical connection between the input terminal contacts 41a and output terminal contacts 41b and simultaneously isolating them from the outside environment by virtue of the sealed barrier to the atmosphere.

Various modifications can be made to the present invention without departing from the apparent scope thereof.

PARTS LIST

- 10: discrete flexible pixel element;
- 11: printed circuit board assembly;
- 13: light emitting elements;
- 13a: electrical conductors;
- 14: input connector;
- 15: pixel element electronics;
- 15a: pixel element drivers;
- 16: output connector;
- 17: flexible cable header;
- 18: flexible cables;
- 19: flexible cable header;
- 20: potting assembly;
- 22: potting shell;
- 22a: ring protrusion;
- 22b: recess;
- 24: upper cavity;
- 24a: upper cavity wall;
- 24b: cavity limit;
- 26: lower cavity;
- 26a: lower cavity wall;
- 26b: cavity limit;
- 28: potting material;
- 29: mechanical fasteners;
- 30: top encasement cover;
- 30a: cavity;
- 30b: ring recess;
- 30c: recess;
- 31a-n: holes;
- 32: bottom gasket;
- 32a: ring extension;
- 34: ring recess;
- 36: back plate;
- 40: input connector shell;
- 40a: cavity;
- 41a: input terminal contacts;
- 41b: output terminal contacts;
- 42a: input connector key;
- 42b: output connector key;
- 43a: input connector protrusion;
- 43b: output connector recess;
- 44: output connector shell; and
- 44a: cavity.

In the appended claims, the terms "including" and "in which" are used as the plain-English equivalents of the respective terms "comprising" and "wherein." Also, in the following claims, the terms "including" and "comprising" are open-ended, that is, a system, assembly, device, apparatus, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A sealed module comprising:
    a circuit board including one or more light-emitting elements coupled to a first surface of the circuit board;
    a potting shell coupled to the circuit board, the potting shell including at least one cavity, the potting shell at least partially enclosing the one or more light-emitting elements; and
    an encapsulating material disposed within the cavity, the encapsulating material encapsulating and sealing at least a portion of the first surface of the circuit board from an environment exterior.

2. The sealed module of claim 1, comprising an encasement cover having an internal cavity configured to receive at least a portion of the potting shell, the circuit board, the one or more light emitting elements, and the encapsulating material.

3. The sealed module of claim 2, wherein the portion of the first surface of the circuit board being encapsulated and sealed includes a portion surrounding each of the light-emitting elements.

4. The sealed module of claim 1, wherein the encapsulating material encapsulates and seals at least a portion of each of the light-emitting elements.

5. The sealed module of claim 1, wherein the at least one cavity is a first cavity and wherein the potting shell includes a second cavity extending from the circuit board in an opposed direction to the first cavity, the second cavity configured to receive encapsulating material.

6. The sealed module of claim 1, wherein the encapsulating material comprises at least one of a ductile foam, a malleable solid potting material, a potting resin configured harden on exposure to the atmosphere, heat, or a reactive agent, and a potting gell configured to harden on exposure to the atmosphere, heat, or a reactive agent, a potting resin and a potting gel that is configured to harden on exposure to the atmosphere, heat, or a reactive agent.

7. The sealed module of claim 1, wherein the encapsulating material hermetically seals at least the first surface of the circuit board from the environment exterior.

8. The sealed module of claim 1, wherein the potting shell is coupled to a perimeter of the circuit board.

9. The sealed module of claim 1, comprising one or more connectors coupled to the circuit board, the one or more connectors configured for input to the circuit board or output from the circuit board, or both.

10. The sealed pixel module of claim 9, wherein each of the one or more connectors are configured for coupling with at least one other sealed module.

11. The sealed module of claim 1, wherein encapsulating and sealing from the environment exterior includes protecting the portion of the first surface of the circuit board from at least one of moisture, humidity, solar radiation, atmospheric pressure changes, vacuum, corrosive chemicals, electrical shock, thermal shock, and mechanical shock.

12. A method, comprising:
providing or receiving a circuit board including one or more light-emitting elements coupled to a first surface of the circuit board;
coupling a potting shell to a perimeter of the circuit board so that the potting shell at least partially encloses the one or more light-emitting elements, the potting shell forming at least one cavity;
disposing an encapsulating material within the at least one cavity, the encapsulating material encapsulating and sealing at least a portion of the first surface of the circuit board from an environment exterior.

13. The method of claim 12, comprising coupling an encasement cover to the potting shell to form a sealed module, the encasement cover having an internal cavity that receives at least a portion of the potting shell, the circuit board, the one or more light emitting elements, and the encapsulation material.

14. The method of claim 12, wherein disposing the encapsulating material within the at least one cavity is performed subsequent to coupling the encasement cover to the potting shell.

15. The method of claim 12, comprising coupling the sealed module to a mounting surface to form an electronic display capable of presenting graphics and video.

16. The method of claim 12, wherein the sealed module is a first sealed module, the method comprising connecting the first sealed module to a second sealed module.

17. The method of claim 16, wherein connecting the first sealed module to the second sealed module includes coupling an output connector of the first sealed module to an input connector of the second sealed module.

18. The method of claim 12, comprising connecting a plurality of sealed modules to form a flexible pixel string.

19. The method of claim 12, wherein the encapsulating and sealing at least the portion of the first surface comprises protecting the portion of the first surface of the circuit board from at least one of moisture, humidity, solar radiation, atmospheric pressure changes, vacuum, corrosive chemicals, electrical shock, thermal shock, and mechanical shock.

20. A method comprising:
providing or receiving a plurality of sealed modules, wherein each sealed module includes:
a circuit board including one or more light-emitting elements coupled to a first surface of the circuit board,
a potting shell coupled to the circuit board, the potting shell including at least one cavity, the potting shell at least partially enclosing the one or more light-emitting elements, and
an encapsulating material disposed within the cavity, the encapsulating material encapsulating and sealing at least a portion of the first surface of the circuit board from an environment exterior; and
coupling the plurality of sealed modules to a mounting surface to form an electronic display.

* * * * *